(12) United States Patent
Jou et al.

(10) Patent No.: US 7,901,962 B1
(45) Date of Patent: Mar. 8, 2011

(54) METHOD FOR PREPARING ORGANIC LIGHT-EMITTING DIODE INCLUDING TWO LIGHT-EMITTING LAYERS WITH TWO SOLVENTS

(75) Inventors: Jwo-Huei Jou, Hsinchu (TW); Pei-Yu Hwang, Hsinchu (TW)

(73) Assignee: National Tsing Hua University, Hsinchu (TW)

( * ) Notice: Subject to any disclaimer, the term of this patent is extended or adjusted under 35 U.S.C. 154(b) by 0 days.

(21) Appl. No.: 12/914,515

(22) Filed: Oct. 28, 2010

(30) Foreign Application Priority Data

Jul. 27, 2010 (TW) ................................ 99124670 A

(51) Int. Cl.
*H01L 21/00* (2006.01)
(52) U.S. Cl. ................................ 438/22; 438/45; 438/46
(58) Field of Classification Search .................... 438/22, 438/45, 46; 257/E51.027
See application file for complete search history.

(56) References Cited

U.S. PATENT DOCUMENTS

2008/0026135 A1 * 1/2008 Bentsen et al. ................. 427/66

* cited by examiner

*Primary Examiner* — William M. Brewster
(74) *Attorney, Agent, or Firm* — Muncy, Geissler, Olds & Lowe, PLLC

(57) ABSTRACT

The present invention relates to a method for preparing an organic light-emitting diode, including: (A) providing a substrate with a first electrode thereon; (B) using a first solution to form a first light-emitting layer over the first electrode, where the first solution includes a first solvent and a first dye; (C) using a second solution to form a second light-emitting layer over the first light-emitting layer, where the second solution includes a second solvent and a second dye, and the first solvent and the second solvent are different solvents and satisfy at least one of the following conditions: the dipole moment difference between the first solvent and the second solvent being 0.5 D or more, or the viscosity of the first solvent being 0.3 mPa·s or more; and (D) forming a second electrode over the second light-emitting layer.

14 Claims, 4 Drawing Sheets

METHOD FOR PREPARING ORGANIC LIGHT-EMITTING DIODE INCLUDING TWO LIGHT-EMITTING LAYERS WITH TWO SOLVENTS

BACKGROUND OF THE INVENTION

1. Field of the Invention

The present invention relates to a method for preparing organic light-emitting diodes and, more particularly, to method for preparing organic light-emitting diodes in large sizes.

2. Description of Related Art

Organic light-emitting diodes (OLEDs) are advantageous in having low weight, thinness (less than 1 mm), high brightness, wide viewing angle (about 170°), no need for backlight, low energy consumption, short response time, high resolution, low heat emission, shock resistance, low producing cost, good flexibility etc., and therefore have drawn much attention to the research in the related fields.

FIG. 1 shows a conventional organic light-emitting diode, which includes: a substrate 11, an anode 12, a hole injection layer 13, a hole transporting layer 14, a light-emitting region 15, an electron transporting layer 16, an electron injection layer 17 and a cathode 18, in which the light-emitting region 15 is disposed between the hole transporting layer 14 and the electron transporting layer 16, and includes a single light-emitting layer or multiple light-emitting layers.

Organic light-emitting diodes can be classified into small molecular organic light-emitting diodes and polymer organic light-emitting diodes according to the types of organic light-emitting materials, in which small molecular organic light-emitting diodes are usually prepared by evaporation and polymer organic light-emitting diodes are mainly prepared by spin coating.

Although the small molecular organic light-emitting diodes in a multi-layered structure can be prepared by evaporation, evaporation is disadvantageous to large-scale manufacture of organic light-emitting diodes and control of content ratio of components included in each light-emitting layer. On the other hand, although the polymer organic light-emitting diodes can be prepared by simpler spin coating, undesirable miscibility between layers is serious during preparing a multi-layered structure. Accordingly, no simple method for stably preparing organic light-emitting diodes in a multi-layered structure has been developed. In particular, the method for preparing small molecular organic light-emitting diodes is limited to evaporation and thus small molecular organic light-emitting diodes cannot be prepared in large sizes.

SUMMARY OF THE INVENTION

The object of the present invention is to provide a method for preparing an organic light-emitting diode, which is a simple method to stably prepare a structure of multi light-emitting layers and is advantageous to large-sized manufacture. Additionally, according to the method of the present invention, the content ratio of components in each light-emitting layer can be easily controlled and thus the color of light emitted by the organic light-emitting diode can be modified.

To achieve the object, the present invention provides a method for preparing an organic light-emitting diode, including the following steps: (A) providing a substrate, a first electrode being disposed on a surface of the substrate; (B) using a first solution to perform a first film-forming process and thus form a first light-emitting layer over the first electrode, wherein the first solution comprises a first solvent and a first dye; (C) using a second solution to perform a second film-forming process and thus form a second light-emitting layer over the first light-emitting layer, wherein the second solution comprises a second solvent and a second dye, and the first solvent and the second solvent are different solvents and satisfy at least one of the following conditions: a dipole moment difference between the first solvent and the second solvent being 0.5 D or more (preferably 0.5 D to 2.0 D, more preferably 0.5 D to 1.3 D, and most preferably 1.0 D to 1.25 D), and a viscosity of the first solvent being 0.3 mPa·s or more (preferably 0.3 mPa·s to 1.0 mPa·s, more preferably 0.4 mPa·s to 0.8 mPa·s, and most preferably 0.4 mPa·s to 0.6 mPa·s); and (D) forming a second electrode over the second light-emitting layer. Herein, the viscosity refers to solvent's viscosity at 20° C. In addition, the first solvent and the second solvent may satisfy both the above-mentioned conditions.

Accordingly, the present invention selects solvents satisfying particular conditions to reduce miscibility between layers during preparing multiple light-emitting layers, such that the organic light-emitting diode with multiple light-emitting layers can be prepared by solution process in large sizes, simplified steps and low cost. In addition, according to the method of the present invention, the content ratio of components in each light-emitting layer can be easily controlled and thus the color of light emitted by the organic light-emitting diode can be modified. In particular, the method according to the present invention can be applied in manufacturing small molecular organic light-emitting diodes and resolve the conventional problem that the method for preparing small molecular organic light-emitting diodes is limited to evaporation.

In the method according to the present invention, the first dye and the second dye are not particularly limited, and may be any conventional fluorescent dye, phosphorescent dye or a mixture thereof. In particular, the first dye and second dye may be any conventional small molecular fluorescent dye, small molecular phosphorescent dye or a mixture thereof. For example, dyes for emitting green light includes, but are not limited to, $CF_3BNO$, $Ir(ppy)_3$, BNE, Alq, DPT, $Alq_3$, $Bebq_2$, DMQA, Coumarin 6, Q, NMQ and Quinacrine etc; dyes for emitting red light includes, but are not limited to, $Ir(piq)_2(acac)$, DCM-2, TMS-SiPc, DCJTB and ABTX etc; dyes for emitting blue light includes, but are not limited to, FIrpic, MDP3FL, DSB, TPAN, DPAN, DPAP, Perylene ($C_{20}H_{12}$), DPVBi, PPD, α-NPD2, β-NPD, TTBND, DCTA, and TDAPTz etc; and dyes for emitting orange light includes, but are not limited to, $Ir(2-phq)_3$.

In the method according to the present invention, the first solution and the second solution may further include a first host material and a second host material, respectively. Herein, the first host material and the second host material are not particularly limited and may be any conventional host material. In particular, the first host material and the second host material may be any conventional small molecular host material, such as CBP, TAZ, TCTA and mCP. If the first dye and the second dye individually include a phosphorescence dye, the first solution and the second solution preferably further include a first host material and a second host material, respectively. If the first dye and the second dye individually include no phosphorescence dye, the first solution and the second solution preferably may selectively include a first host material and a second host material, respectively. For example, the first solution may include a first dye, in which the first dye preferably includes MDP3FL and DSB, according to one aspect of the present invention, the amount of DSB being about 3 wt % of the MDP3FL, and the second solution may include a second dye and a second host material, in which the second dye preferably includes $Ir(piq)_2(acac)$, $Ir(2-phq)_3$, $CF_3BNO$ and Flrpic and the second host material preferably is CBP, according to one aspect of the present invention, the amount of $Ir(piq)_2(acac)$ being about 0.1 wt % of the second host material, the amount of $Ir(2-phq)_3$ being about 0.6 wt % of the second host material, the amount of $CF_3BNO$ being about 0.2 wt % of the second host material and the amount of Flrpic being about 14 wt % of the second host material.

In the method according to the present invention, the first solvent may be any solvent which satisfies at least one of the above-mentioned conditions and can dissolve the materials included in the first light-emitting layer (such as a first dye and a first host material), and the second solvent may be any solvent which satisfies at least one of the above-mentioned conditions and can dissolve the materials included in the second light-emitting layer (such as a second dye and a second host material). For example, the first solvent and the second solvent may respectively be dichloromethane and toluene, toluene and dichloromethane, or dichloromethane and dimethyl ether. Accordingly, in preparing the first light-emitting layer and the second light-emitting layer, the miscibility between layers can be reduced by the particular selection of the first solvent and the second solvent.

The method according to the present invention may further include a step (A1) before the step (B): forming a hole injection layer on the first electrode, in which the first film-forming process is performed on the hole injection layer; or include a step (A2) before the step (B): forming a hole transporting layer over the first electrode, in which the first film-forming process is performed on the hole transporting layer; or include a step (A1) and a step (A2) in sequence before the step (B): (A1) forming a hole injection layer on the first electrode, and (A2) forming a hole transporting layer on the hole injection layer, in which the first film-forming process is performed on the hole transporting layer.

The method according to the present invention may further include a step (C1) before the step (D): forming an electron transporting layer over the second light-emitting layer, in which the second electrode is formed over the electron transporting layer; or include a step (C2) before the step (D): forming an electron injection layer over the second light-emitting layer, in which the second electrode is formed on the electron injection layer; or include a step (C1) and a step (C2) in sequence before the step (D): (C1) forming an electron transporting layer over the second light-emitting layer, and (C2) forming an electron injection layer on the second light-emitting layer, in which the second electrode is formed on the electron injection layer.

The method according to the present invention may further include a step (B1) before the step (C): using a third solution to perform a third film-forming process and thus form an inter-layer over the first light-emitting layer, in which the third solution includes a third solvent and an inter-layer material, and the third solvent is the same as the second solvent.

In the present invention, preferably, the inter-layer emits no light and is used to control holes and electrons to combine in the first light-emitting layer and the second light-emitting layer and thus to emit light. Herein, the inter-layer material may be a host material, a fluorescent dye or a mixture thereof, and preferably is TCTA, CBP, 4P-NPD, TPBi, $Alq_3$ or a mixture thereof.

In the method according to the present invention, the first film-forming process preferably includes a first coating step and a first thermal treating step, in which the first thermal treating step is performed after the first coating step. Preferably, the first coating step is performed at a temperature from room temperature to 90° C. for 20 seconds to 30 seconds; and the first thermal treating step is performed at a temperature from 90° C. to 120° C. for 30 minutes to 60 minutes.

In the method according to the present invention, the second film-forming process preferably includes a second coating step and a second thermal treating step, in which the second thermal treating step is performed after the second coating step. Preferably, the second coating step is performed at a temperature from room temperature to 90° C. for 20 seconds to 30 seconds; and the second thermal treating step is performed at a temperature from 90° C. to 120° C. for 30 minutes to 60 minutes.

In the method according to the present invention, the third film-forming process preferably includes a third coating step and a third thermal treating step, in which the third thermal treating step is performed after the third coating step. Preferably, the third coating step is performed at a temperature from room temperature to 90° C. for 20 seconds to 30 seconds; and the third thermal treating step is performed at a temperature from 90° C. to 120° C. for 30 minutes to 60 minutes.

In the method according to the present invention, the material of the hole injection layer is not particularly limited, and may be any conventional hole injection material, such as PEDOT, PEDOT:PSS, CuPC, TCTA, T-NATA, m-MTDATA, TiOPC, but is not limited thereto.

In the method according to the present invention, the material of the electron injection layer is not particularly limited, and may be any conventional hole electron material, such as LiF, CsF, $Li_2O$, but is not limited thereto.

In the method according to the present invention, the material of the hole transporting layer is not particularly limited, and may be any conventional hole transporting material, such as TAPC, TPD, NPB, but is not limited thereto.

In the method according to the present invention, the material of the electron transporting layer is not particularly limited, and may be any conventional electron transporting material, such as CBP, TAZ, BCP, PBD, Alq3, but is not limited thereto.

In the method according to the present invention, the substrate may be any conventional suitable transparent substrate, such as a glass substrate or a plastic substrate.

In the method according to the present invention, the first electrode may be an anode and may be made of any conventional suitable transparent conductive material, such as ITO.

In the method according to the present invention, the second electrode may be a cathode and may be made of any conventional suitable metal, such as Al.

Other objects, advantages, and novel features of the invention will become more apparent from the following detailed description when taken in conjunction with the accompanying drawings.

DETAILED DESCRIPTION OF THE PREFERRED EMBODIMENT

Hereafter, examples will be provided to illustrate the embodiments of the present invention. Other advantages and effects of the invention will become more apparent from the disclosure of the present invention. Other various aspects also may be practiced or applied in the invention, and various modifications and variations can be made without departing from the spirit of the invention based on various concepts and applications.

Example 1

FIGS. 2A to 2F show cross-sectional views of preparing an organic light-emitting diode according to the present example.

Figure 1:
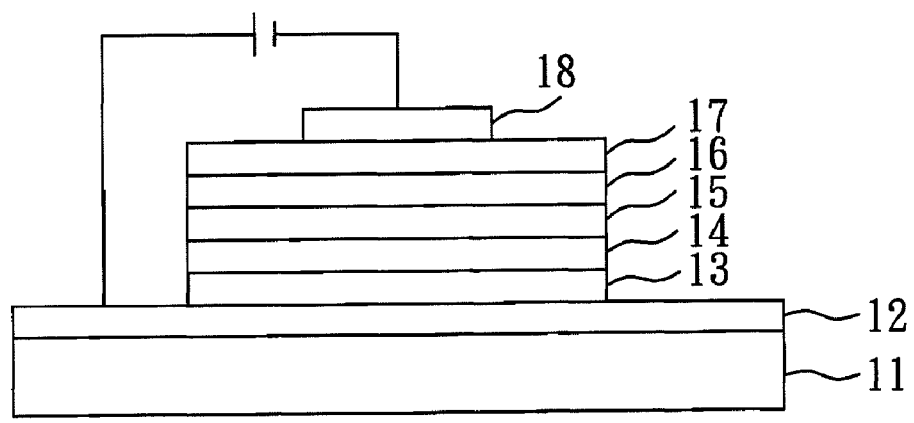
FIG. 1 shows a cross-sectional view of a conventional organic light-emitting diode.
Figure 2A:
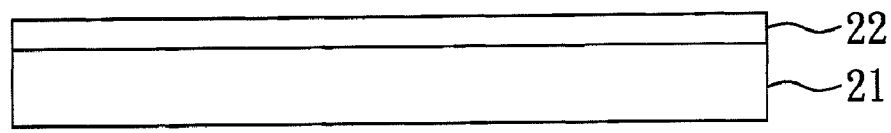
FIGS. 2A to 2F show cross-sectional views of preparing an organic light-emitting diode according to a preferred example of the present invention.

As shown in FIG. 2A, a substrate 21 with a first electrode 22 thereon is first provided and cleaned. In detail, the present example uses an ITO glass substrate, in which the glass substrate is used as the substrate 21 and the ITO anode is used as the first electrode 22. In the present example, the ITO glass substrate is first rubbed and cleaned by using detergent to remove oily sludge and contaminants on its surface, and then is cleaned in an ultrasonic cleaner with propanol and then isopropanol each for about 10 minutes. Subsequently, the ITO glass substrate is reversely put into a boiling hydrogen peroxide solution for about 10 minutes to perform surface active treatment and thus enhance surface work function of ITO so as to easily inject holes into the organic element. Finally, the ITO glass substrate is cleaned in an ultrasonic cleaner with isopropanol for about 3 minutes, and then the ITO surface is dried with $N_2$ flow.

Figure 2B:
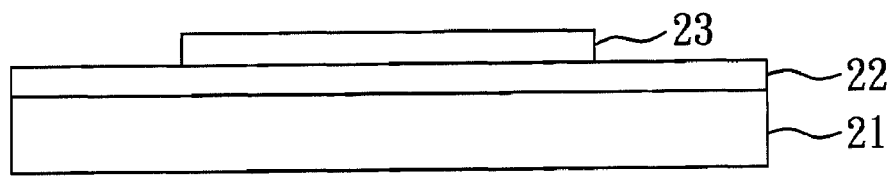

As shown in FIG. 2B, a hole injection layer 23 is formed on the first electrode 22. In detail, the present example performs a spin coating process to coat PEDOT/PSS polymer mixture on the first electrode 22 under about 4,000 rpm for 20 seconds to form a hole injection layer 23 in a thickness of about 30 nm.

Figure 2C:

Subsequently, as shown in FIG. 2C, a first light-emitting layer 251 is formed on the hole injection layer 23 by using a first solution to perform a first film-forming process, in which the first solution includes a first solvent and a first dye. In detail, according to the present example, a deep blue dye MDP3FL and an azure dye DSB are used as the first dye in weight ratio of 100:3, and dichloromethane is used as the first solvent. Accordingly, the first dye is added into the first solvent, followed by stirring for 30 minutes at 45° C., to form the first solution. Then, the first solution is coated on the hole injection layer 23 by spin coating under 2,500 rpm for 20 seconds. Subsequently, the component coated with the first solution is placed in a vacuum oven to perform thermal treatment for removing solvent under vacuum of $10^{-3}$ torr at 120° C. for 1 hour to accomplish the first film-forming process and thus form a first light-emitting layer 251 (i.e. a blue light-emitting layer) in a thickness of about 15 nm.

Figure 2D:
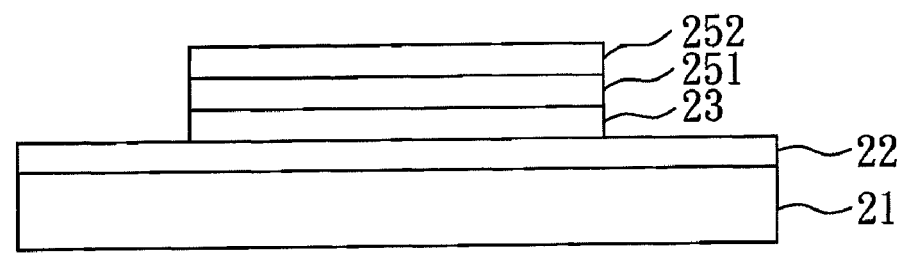
Figure 2E:
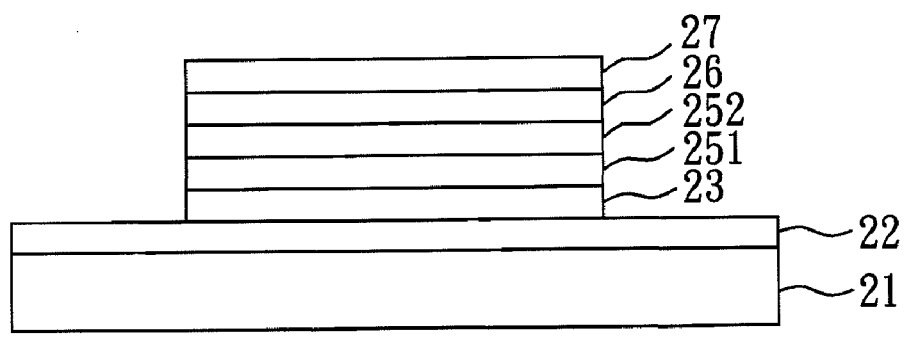

Next, as shown in FIG. 2E, an electron transporting layer 26 and an electron injection layer 27 are formed on the second light-emitting layer 252 in sequence. In detail, according to the present example, TPBi is deposited on the second light-emitting layer 252 in a deposition rate of 1.5 to 2 Å/sec to form an electron transporting layer 26 in a thickness of about 32 nm. Then, LiF is deposited on the electron transporting layer 26 in a deposition rate of 0.1 Å/sec to form an electron injection layer 27 in a thickness of about 0.8 nm.

Figure 2F:
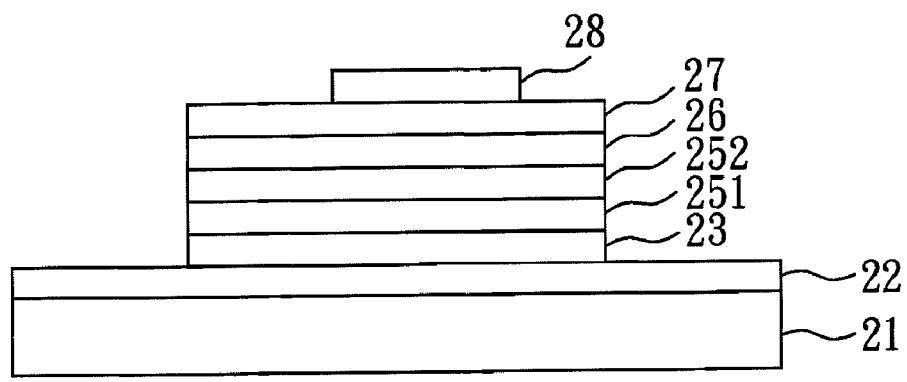

Finally, as shown in FIG. 2F, a second electrode 28 is formed on the electron injection layer 27. In detail, the present example performs a vacuum evaporating process to deposit aluminum on the electron injection layer 27 in a deposition rate of 9 to 12 Å/sec under vacuum of $10^{-5}$ torr to form a second electrode 28 in a thickness of about 150 nm.

Example 2

The structure and the manufacturing method of the organic light-emitting diode according to the present example are the same as those illustrated in Example 1, except that the present example uses toluene and dichloromethane as the first solvent and the second solvent, respectively.

Example 3

The structure and the manufacturing method of the organic light-emitting diode according to the present example are the same as those illustrated in Example 1, except that the present example uses dimethyl ether as the second solvent.

Example 4

Figure 3A:
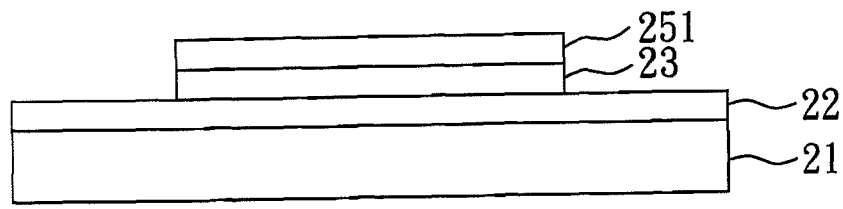
FIGS. 3A to 3C show cross-sectional views of preparing an organic light-emitting diode according to another preferred example of the present invention.
Figure 3B:
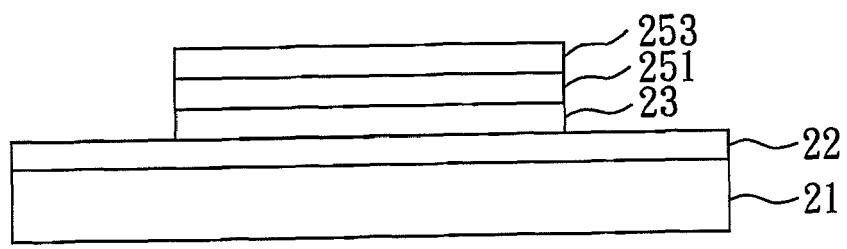
Figure 3C:
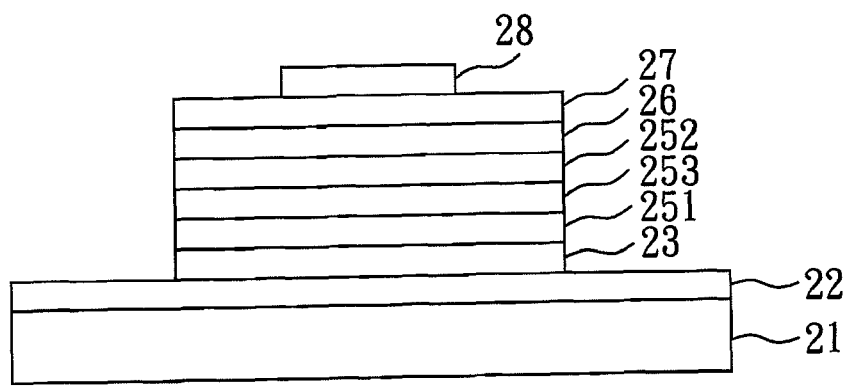

FIGS. 3A to 3C show cross-sectional views of preparing an organic light-emitting diode according to the present example.

First, a structure as shown in FIG. 3A is prepared by the steps shown in FIGS. 2A to 2C of Example 1. Then, as shown in FIG. 3B, an inter-layer 253 is formed on the first light-emitting layer 251 by using a third solution to perform a third film-forming process, in which the third solution includes a third solvent and an inter-layer material. In detail, the present example uses TCTA and toluene as the inter-layer material and the third solvent, respectively. Accordingly, the inter-layer material is added into the third solvent, followed by stirring for 30 minutes at 45° C., to form the third solution. Then, the third solution is coated on the first light-emitting layer 251 by spin coating under 2,500 rpm for 20 seconds. Subsequently, the component coated with the third solution is placed in a vacuum oven to perform thermal treatment for removing solvent under vacuum of $10^{-3}$ torr at 120° C. for 1 hour to accomplish the third film-forming process and thus form an inter-layer 253 in a thickness of about 5 nm.

Finally, as shown in FIG. 3C, a second light-emitting layer 252, an electron transporting layer 26, an electron injection layer 27 and a second electrode 28 are formed on the inter-layer 253 in sequence by the steps shown in FIGS. 2D to 2F of Example 1.

Although the present invention has been explained in relation to its preferred embodiment, it is to be understood that many other possible modifications and variations can be made without departing from the scope of the invention as hereinafter claimed.

What is claimed is:

1. A method for preparing an organic light-emitting diode, comprising:
   (A) providing a substrate, a first electrode being disposed on a surface of the substrate;
   (B) using a first solution to perform a first film-forming process and thus form a first light-emitting layer over the first electrode, wherein the first solution comprises a first solvent and a first dye;
   (C) using a second solution to perform a second film-forming process and thus form a second light-emitting layer over the first light-emitting layer, wherein the second solution comprises a second solvent and a second dye, and the first solvent and the second solvent are different solvents and satisfy at least one of the following conditions: a dipole moment difference between the first solvent and the second solvent being 0.5 D or more, and a viscosity of the first solvent being 0.3 mPa·s or more; and
   (D) forming a second electrode over the second light-emitting layer.

2. The method as claimed in claim 1, wherein the first solvent and the second solvent respectively are dichloromethane and toluene, toluene and dichloromethane, or dichloromethane and dimethyl ether.

3. The method as claimed in claim 1, wherein the first solution further comprises a first host material.

4. The method as claimed in claim 1, wherein the second solution further comprises a second host material.

5. The method as claimed in claim 1, wherein the first dye comprises MDP3FL and DSB.

6. The method as claimed in claim 4, wherein the second dye comprises $Ir(piq)_2(acac)$, $Ir(2-phq)_3$, $CF_3BNO$ and Flrpic.

7. The method as claimed in claim 4, wherein the second host material is CBP.

8. The method as claimed in claim 1, further comprising a step (A1) before the step (B): forming a hole injection layer on the first electrode, wherein the first film-forming process is performed on the hole injection layer.

9. The method as claimed in claim 1, further comprising a step (C1) before the step (D): forming an electron transporting layer over the second light-emitting layer, wherein the second electrode is formed over the electron transporting layer.

10. The method as claimed in claim 1, further comprising a step (C2) before the step (D): forming an electron injection layer over the second light-emitting layer, wherein the second electrode is formed on the electron injection layer.

11. The method as claimed in claim 9, further comprising a step (C2) before the step (D) and after the step (C1): forming an electron injection layer on the electron transporting layer, wherein the second electrode is formed on the electron injection layer.

12. The method as claimed in claim 1, further comprising a step (B1) before the step (C): using a third solution to perform a third film-forming process and thus form an inter-layer over the first light-emitting layer, wherein the third solution comprises a third solvent and an inter-layer material, and the third solvent is the same as the second solvent.

13. The method as claimed in claim 12, wherein the inter-layer material is a host material, a fluorescent dye or a mixture thereof.

14. The method as claimed in claim 12, wherein the inter-layer material is TCTA, CBP, 4P-NPD, TPBi, $Alg_3$ or a mixture thereof.

* * * * *